United States Patent [19]

Stevens

[11] Patent Number: 4,737,469
[45] Date of Patent: Apr. 12, 1988

[54] CONTROLLED MODE FIELD EFFECT TRANSISTORS AND METHOD THEREFORE

[75] Inventor: Emsley H. Stevens, Plymouth, Minn.

[73] Assignee: Honeywell Inc., Minneapolis, Minn.

[21] Appl. No.: 837,871

[22] Filed: Mar. 7, 1986

Related U.S. Application Data

[62] Division of Ser. No. 571,978, Jan. 19, 1984, abandoned.

[51] Int. Cl.$^4$ ........................... H01L 29/70; H01L 29/80
[52] U.S. Cl. ........................................ 437/33; 437/39; 437/40; 437/59; 357/22; 357/43
[58] Field of Search .................. 357/43; 437/33, 39, 437/40, 59

[56] References Cited

U.S. PATENT DOCUMENTS 4,228,450 10/1980 Anantha et al. ............... 357/51
4,546,370 10/1985 Curran ......................... 357/43

FOREIGN PATENT DOCUMENTS 2951931  2/1981  Fed. Rep. of Germany ........ 357/43
0165669 12/1980  Japan ................................... 357/43
0197869 11/1983  Japan ................................... 357/43

OTHER PUBLICATIONS

Muggli, IBM Tech. Disc. Bull., v. 24(2), pp. 997–998 (Jul., 1981).

Primary Examiner—Olik Chaudhuri
Attorney, Agent, or Firm—William T. Udseth

[57] ABSTRACT

A standard JFET or MESFET with a second gate is described. The second gate underlies the channel region, but is accessible from the same surface of the semiconductor body as are the other terminals of the transistor. Electrical signals are transmitted to the second gate by a heavily doped interconnect region. Isolation techniques prevent a voltage applied to this second gate from having a significant effect on adjoining electronic devices. Also described is a process for manufacturing such transistors using only steps which are present in a typical bipolar processing sequence.

4 Claims, 3 Drawing Sheets

CONTROLLED MODE FIELD EFFECT TRANSISTORS AND METHOD THEREFORE

This application is a division of application Ser. No. 571,978, filed Jan. 19, 1984, abandoned.

The present invention relates to junction field effect transistors (JFET's) and metal semiconductor field effect transistors (MESFET's), and more specifically to those JFET's and MESFET's capable of having their threshold voltage or their operational mode altered.

BACKGROUND OF THE INVENTION

A field effect transistor may operate in either the enhancement or the depletion mode. A device operating in the enhancement mode will exhibit no effective electrical conduction between the source and the drain regions when the gate to source voltage is equal to zero volts, assuming of course a source to drain voltage within design tolerances of the device. The minimum magnitude of gate to source voltage which will allow effective electrical current to flow between the source and the drain regions is known as the threshold voltage of the enhancement mode device. For a depletion mode device an effective electrical current may flow between the source and the drain when the gate to source voltage is equal to zero volts. The threshold voltage of the depletion mode device is the minimum magnitude of gate to source voltage which will block effective electrical conduction between the source and drain regions.

A property which is often useful in a field effect transistor is the ability to adjust the threshold voltage, or even to control whether the device operates in the enhancement or depletion mode. Typically in the prior art such control has been provided by electrically biasing the underlying substrate. While this technique is satisfactory in some circumstances, it also has significant disadvantages. Typically when a substrate bias is applied, such bias is necessarily applied to the entire substrate. Therefore a bias applied in order to control the threshold voltage of one field effect transistor will affect the threshold voltage of all field effect transistors constructed on that substrate. Furthermore if other semiconductor devices, such as bipolar transistors, are constructed on the same substrate their performance may be adversely affected by the presence of a substrate bias voltage. Alternatively other devices present on the substrate may require a particular substrate bias voltage for proper operation. Such a substrate bias may affect the operation of field effect transistors located on the substrate.

Another problem inherent in the integration of field effect transistors with bipolar devices lies in the differences between the basic processing steps used to manufacture each.

SUMMARY OF THE INVENTION

The present invention provides a standard JFET or MESFET with a second gate. The second gate underlies the channel region, but is accessible from the same surface of the semiconductor body as are the other terminals of the transistor. Electrical signals are transmitted to the second gate by a heavily doped interconnect region. Isolation techniques prevent a voltage applied to this second gate from having a significant effect on adjoining electronic devices.

The present invention furthermore provides a field effect transistor which may be manufactured using steps present in standard bipolar processes. Therefore integrated circuits containing both field effect and bipolar devices may be more easily and efficiently manufactured.

DETAILED DESCRIPTION OF THE PREFERRED EMBODIMENT

The preferred embodiment will be described with respect to silicon based n-channel field effect transistors. Those skilled in the art will readily perceive that the present invention could equally well be used with semiconductor materials other than silicon. For example, a JFET or MESFET utilizing the invention could be constructed of GaAs. Additionally, the invention could be utilized in a p-channel device simply by changing all n-type regions to p-type regions and changing all p-type regions to n-type regions.

Figure 1:
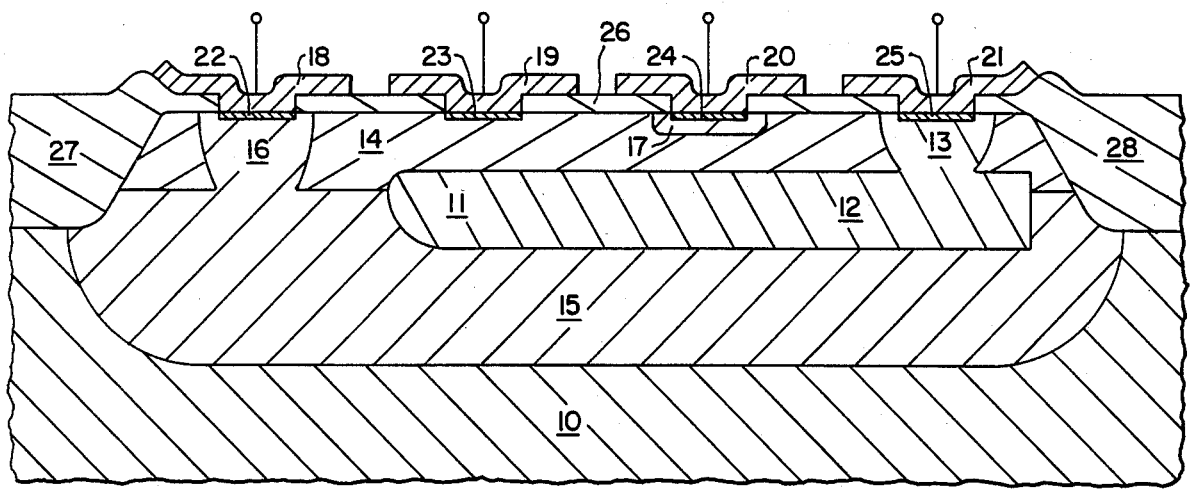
FIG. 1 is a cross sectional view of a MESFET of the invention.

FIG. 1 illustrates a MESFET utilizing the invention. As shown in FIG. 1 the invention includes p-type region 10, p+ regions 11, 12, and 13, n region 14, n+ regions 15, 16, and 17, metallic conductor pads 18, 19, 20, and 21, metal silicide regions 22, 23, 24, and 25, and dielectric regions 26, 27, and 28.

More specifically the device shown in FIG. 1 includes a substrate region 10 doped to have a p-type conductivity. Overlying the substrate region is a region 15 doped to have an n+-type conductivity. Overlying n+-type region 15 is an epitaxial layer 14 doped to have n-type conductivity. Embedded within epitaxial layer 14 are heavily doped n+-type regions 16 and 17 which serve as source and drain regions respectively. As illustrated in FIG. 1, region 16 and the portion of region 15 immediately to the right of region 16 in the Figure act as a buried, distributed source region. A surface source region could equally well be used with a MESFET constructed according to the invention.

A dielectric layer 26 covers the surface of epitaxial layer 14. Dielectric layer 26 is typically of $SiO_2$ and provides passivation for the semiconductor material as well as electrical insulation between epitaxial layer 14 and any electrical conductors which might contact the surface of dielectric layer 26.

Portions of dielectric layer 26 are removed in order to provide electrical contact to source region 16 and drain region 17. Additionally a portion of dielectric layer 26 is removed in order to provide the first gate. Metallic conductor pads 18, 19, and 20, are provided in such a manner that they will contact the semiconductor material in the regions where the portions of dielectric layer 26 have been so removed. Typically, metallic conductor pads 18, 19, and 20 are of aluminum over a metal silicide, although other metals or combinations of metals may be used. Typically the process of applying metallic conductor materials to form pads 18, 19, and 20 on the semiconductor body will cause metal silicide regions 22, 23, and 24 to form through reaction of an appropriate metal with the underlying silicon. If the reactive material used to form regions 22, 23, and 24 is palladium the metal silicide will be $Pd_2Si$.

Metallic conductor pad 19 contacts epitaxial layer 14 through the opening made in dielectric layer 26. Because epitaxial layer 14 is not heavily doped the junction region between metal silicide region 23 and epitaxial layer 14 forms an effective Schottky diode. Metal silicide region 23 serves as a first gate for the transistor. Because of the nature of this gate a MESFET is sometimes called a Schottky gate field effect transistor.

In addition to the structure described above, FIG. 1 includes a second gate 11 which is formed by silicon doped to have a p+-type conductivity. Second gate region 11 receives electrical signals through interconnect regions 12 and 13, both of which are also doped to have a p+-type conductivity. An additional opening is formed in dielectric layer 26 in order that metallic conductor pad 21 may be in electrical contact with interconnect region 13. As with metallic conductor pads 18, 19, and 20 a metal silicide region 25 will typically be formed underneath contact pad 21. Also as with metallic conductor pads 18, 19, and 20, pad 21 is typically of aluminum although other materials may also be used.

Electrical potentials applied to second gate 11 are confined to the p+ region of second gate 11 and p+ interconnect regions 12 and 13 by means of p-n junction isolation between both p+ gate region 11 and p+ interconnect region 12 and n+ region 15. Additionally the active region of the device, including source region 16, drain region 17, and epitaxial layer 14 are isolated from adjoining semiconductor devices by means of dielectric isolation provided by dielectric regions 27 and 28. Region 15, which underlies the device, is electrically isolated from other devices by the p-n junction between regions 15 and 10.

Figure 2:
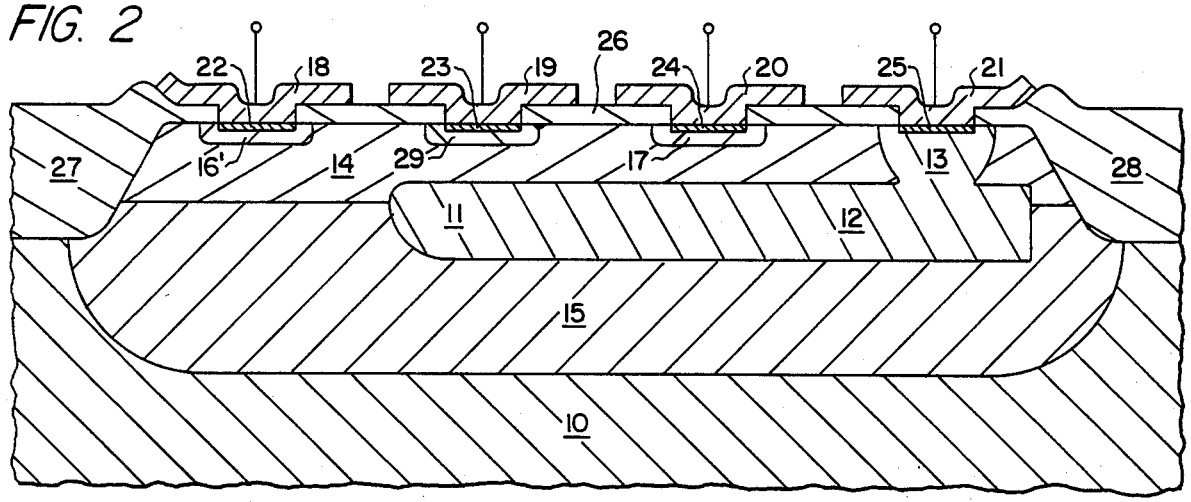
FIG. 2 is a cross sectional view of a JFET of the invention.

Turning now to FIG. 2 a JFET including the invention is illustrated. Most of the regions of a JFET formed according to the structure shown in FIG. 2 correspond precisely to regions illustrated in FIG. 1. Therefore, only those regions which differ will be described.

One difference is that distributed, buried source formed by portions of regions 15 and 16 of FIG. 1 has been replaced by surface source region 16' of FIG. 2. As in the MESFET of FIG. 1 either a surface source region or a buried, distributed source region may be used according to what is desired for a particular implementation of the invention.

A second difference between the structure of FIG. 1 and the structure of FIG. 2 lies in the nature of the first gate. According to the structure of FIG. 1 metal silicide region 23 acts as the first gate. In the structure of FIG. 2 region 29 of p+-type conductivity is formed in epitaxial layer 14 by insertion therein of sufficient quantities of an appropriate dopant. Region 29 then serves as a first gate region.

In operation, either of the structures shown in FIG. 1 or in FIG. 2 typically would have second gate 11 biased to produce the desired threshold voltage or mode of operation while the first gate, 19 or 29, would have applied thereto a signal. This signal would then be used to modulate the flow of effective electrical current through the device.

A more specific discussion of the operation of a typical MESFET incorporating the invention will be given. Those skilled in the art will realize that the operational parameters given below may be varied as desired in a specific implementation.

Figure 3:
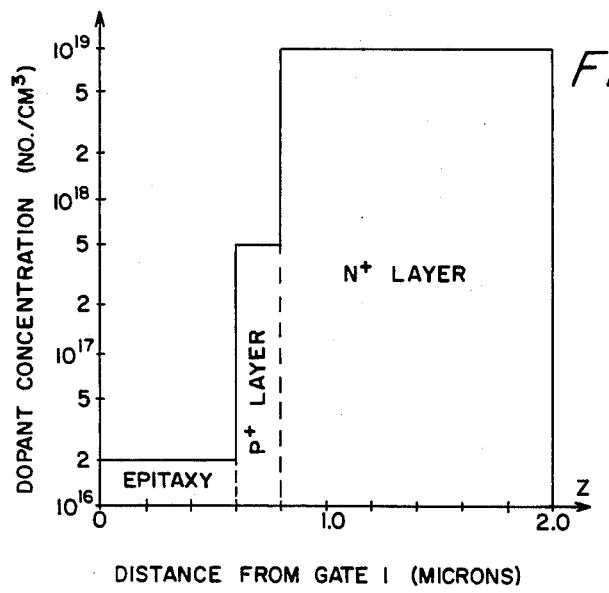
FIG. 3 is a graph showing idealized doping concentrations in a MESFET of the invention.

FIG. 3 illustrates the idealized dopant concentrations along a cross section of the device running through the first and second gates. As may be seen in FIG. 3 epitaxial layer 14 has a dopant concentration of approximately $2 \times 10^{16}$ atoms/cm$^3$. Typically the dopant used would be arsenic or phosphorous in order to provide an n-type conductivity. Second gate region 11 has a dopant concentration of approximately $5 \times 10^{17}$ atoms/cm$^3$. Typically boron would serve as a dopant for the second gate. Finally a concentration of about $10^{19}$ atoms/cm$^3$ is provided in n+ region 15. Again either arsenic or phosphorous may be used as a dopant in region 15.

Figure 4:
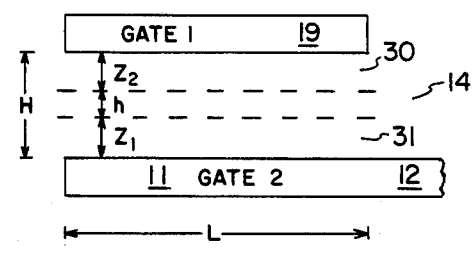
FIG. 4 is an enlarged view of a portion of FIG. 1, FIGS. 5, 6, 7, and 8 are graphs showing current-voltage curves for a MESFET of the invention.
Figure 5:
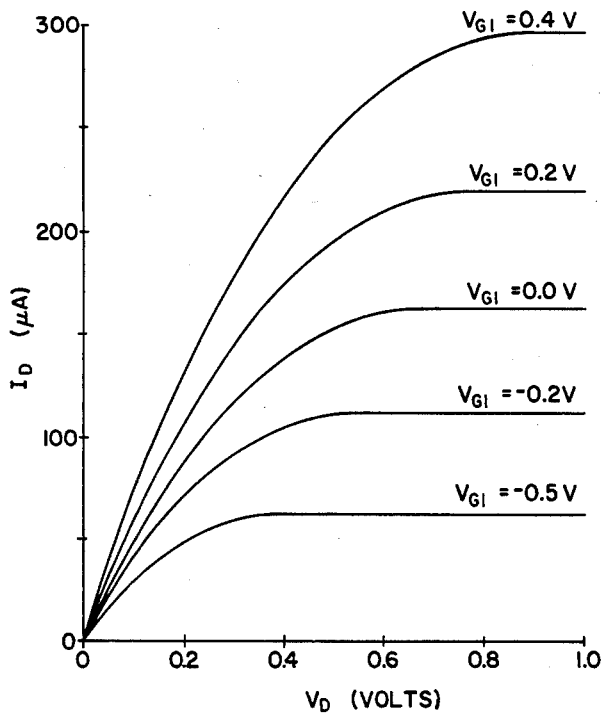
Figure 6:
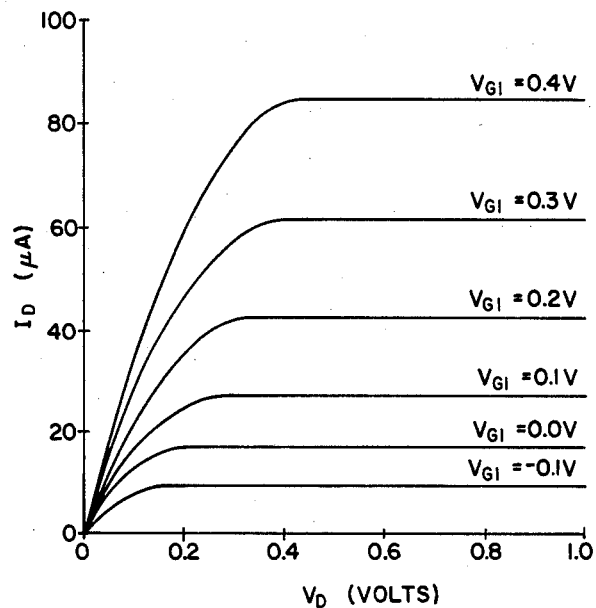
Figure 7:
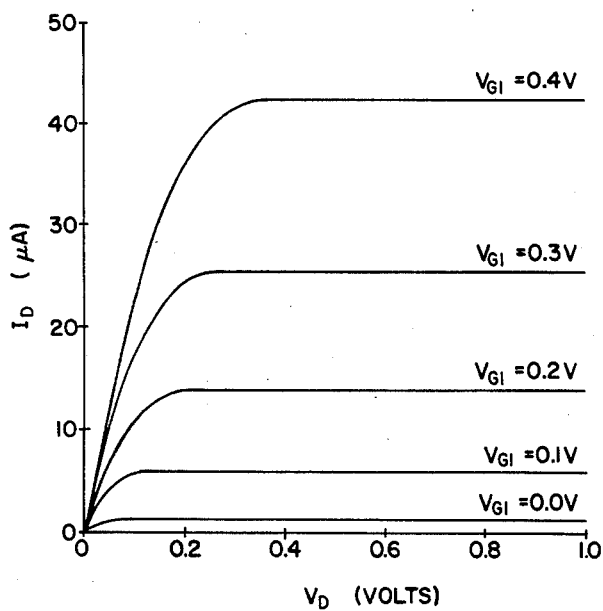
Figure 8:
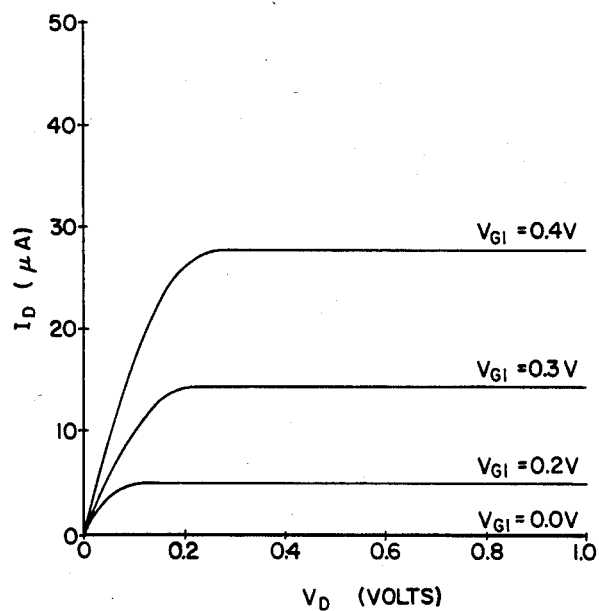

FIG. 4 illustrates an enlarged view of the region of the device including metal silicide region 23, second gate region 11, and the portion of epitaxial layer 14 lying therebetween. The distance between metal silicide region 23 and second gate region 11 is designated by H. As may be seen from FIG. 3, H is approximately 0.6 $\mu$m.

Also shown explicitly in FIG. 4 are depletion regions 30 and 31 associated with the first and second gates respectively. The thickness of depletion region 30 is designated by $Z_1$, and the thickness of depletion region 31 is designated by $Z_2$. The distance between these depletion regions, i.e. the effective channel thickness, is designated by h.

The values of $Z_1$ and $Z_2$ may be calculated from standard device theory as shown below:

$$Z_1 = \left[ \frac{2\epsilon_s}{eN_D} (V_{B1} - V_{G1}) \right]^{\frac{1}{2}} \quad (1)$$

$$Z_2 = \left[ \frac{2\epsilon_s}{eN_D} (V_{B2} - V_{G2}) \right]^{\frac{1}{2}} \quad (2)$$

In these equations $\epsilon_s$ represents the dielectric constant of silicon which is approximately $10^{-12}$ F/cm, e represents the electronic charge or approximately $1.6 \times 10^{-19}$ Coul., $N_D$ represents the donor concentration in the epitaxial layer, $V_{B1}$ and $V_{B2}$ represent the intrinsic potential differences at the junctions between the first gate and the channel and the second gate and the channel respectively, and $V_{G1}$ and $V_{G2}$ represent the voltages applied between the source and the first and second gates respectively. For a MESFET having a first gate of $Pd_{2si}$ and having the doping profile shown in FIG. 3 $V_{B1}$ is approximately 0.7 volts and $V_{B2}$ is approximately 0.82 volts. Therefore, using equations (1) and (2):

$$Z_1 = 0.25 \sqrt{0.7 - V_{G1}} \qquad (3)$$

$$Z_2 = 0.25 \sqrt{0.82 - V_{G2}} \qquad (4)$$

where $Z_1$ and $Z_2$ are calculated in $\mu$m.

The channel height when both gates are at zero volts relative to the source voltage, designated $h_o$, may be calculated from equations (3) and (4) and the value of H.

$$\begin{aligned} h_0 &= H - (Z_1 + Z_2) \qquad (5) \\ &= H - 0.25 (\sqrt{0.7 - V_{G1}} + \sqrt{0.82 - V_{G2}}) \\ &= 0.6 - 0.25 (\sqrt{0.7} + \sqrt{0.82}) \\ &= 0.16 \ \mu m \end{aligned}$$

The zero bias channel conductance, $G_o$, may be calculated as shown below.

$$G_o = (e\mu_n N_D) h_o (W/D) \qquad (6)$$

In equation (6) $\mu_n$ represents the electron mobility in the channel region, W represents the channel width and L represents the channel length. Given that $\mu_n$ is approximately 1000 cm$^2$/volt-sec at typical operating temperatures and designing the device so that (W/L) is equal to 10 then $G_o = 5.12 \times 10^{-4}$ Ohm$^{-1}$.

Those skilled in the art will perceive that the device as described above operates as a depletion mode device. By application of an appropriate bias voltage between either the first or second gate, or both gates, and the source, the threshold voltage of the device may be altered. If the bias voltage is sufficiently large the device will operate as an enhancement mode device. The bias which must be applied to the second gate to convert the device to enhancement mode may be straightforwardly calculated as the bias required to reduce h to zero with no bias applied to the first gate. From the values given above the necessary bias may be calculated.

$$h = H - 0.25 (\sqrt{0.7 - V_{G1}}) + (\sqrt{0.82 - V_{G2}})$$

$$0 = 0.6 - 0.25 (\sqrt{0.7}) - 0.25 (\sqrt{0.82 - V_{G2}})$$

$$V_{G2} = 1.61 \text{ volts}$$

FIGS. 5, 6, 7, and 8 are current-voltage curves for a MESFET as described above with the second gate biased at zero volts, $-1$ volt, $-1.4$ volts, and $-1.6$ volts, respectively. In each of these cases the source is held at zero volts. In each graph $V_D$ represents the drain voltage and $I_D$ represents the drain current. As may be seen from these curves when the second gate is biased at zero volts or $-1$ volt, the transistor operates as a depletion mode device. When the bias goes to $-1.4$ volts the transistor remains in the depletion mode, but with a lower channel conductivity for a given voltage applied to the first gate. When the bias goes to $-1.6$ volts the transistor acts as an enhancement mode device as shown by the fact that the drain current is negligible when a zero volt potential is applied to the first gate, regardless of the drain voltage.

As stated above, a field effect device having the structure of the present invention may be manufactured using process steps present in standard bipolar manufacturing processes. This is advantageous because both types of devices may be manufactured on a single substrate without the requirements of any additional process steps, beyond those that would otherwise be required for the bipolar devices.

Figure 9:
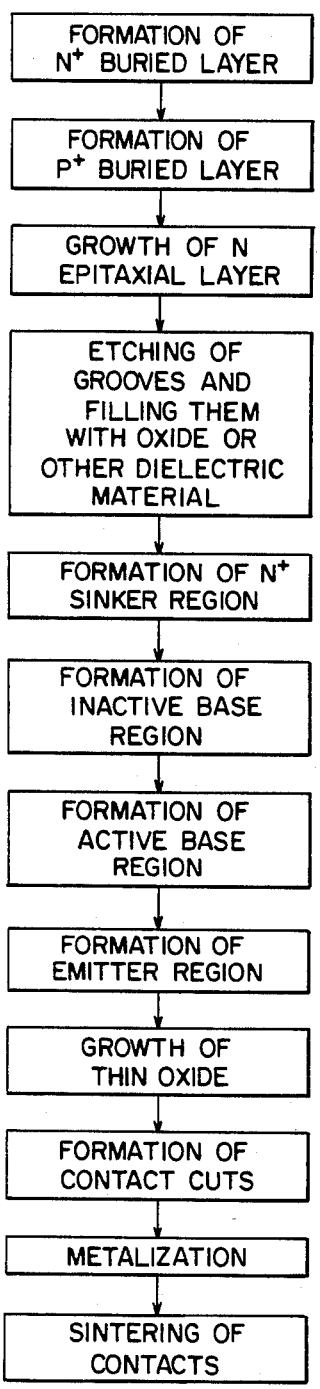
FIG. 9 is a flow chart of a typical process for manufacturing a bipolar transistor.

FIG. 9 is a flow chart of a typical bipolar processing sequence. In this flow chart photoresist and heat treatment steps are omitted.

FIGS. 10A through F show stages in the construction of a MESFET with a surface source region. The process sequence involves only steps which are already present in the bipolar processing sequence of FIG. 9.

Figure 10A:
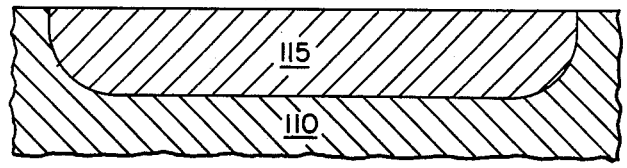
FIGS. 10A through 10F show steps in a process for manufacturing an FET according to the present invention.
Figure 10B:
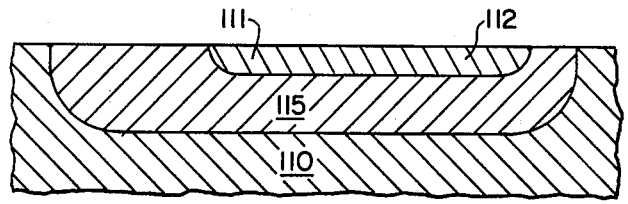

The processing begins with a wafer of silicon. A dopant which will cause silicon to have n-type conductivity when present therein in sufficient quantities is introduced into the wafer, adjacent to a major surface thereof. Typically the dopant is phosphorous or arsenic and a dose of approximately $1.5 \times 10^{15}$ ions/cm$^2$ is ion implanted at an energy of 60 KeV. The structure which is formed by this step is shown in FIG. 10A where n+ region 115 overlies selected portions of substrate 110. This implantation step is consistent with the first step shown in FIG. 9, the formation of an n+ buried layer.

The second step of the bipolar process of FIG. 9 is the formation of a p+ buried layer. In this step a dopant which causes silicon to have a p-type conductivity when implanted therein in sufficient quantities, typically boron, is implanted to form p+ regions 111 and 112 of FIG. 10B. Typically about $4 \times 10^{13}$ ions/cm$^2$ are implanted with an energy of 100 KeV in this step.

Figure 10C:
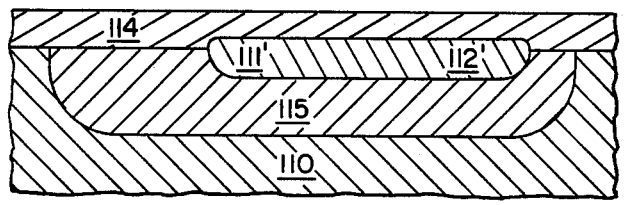
Figure 10D:
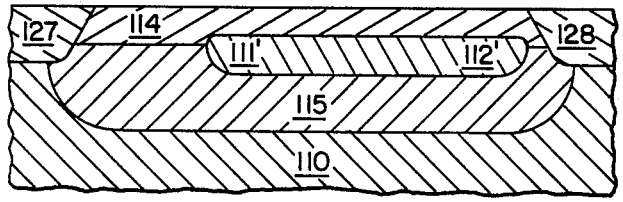
Figure 10E:
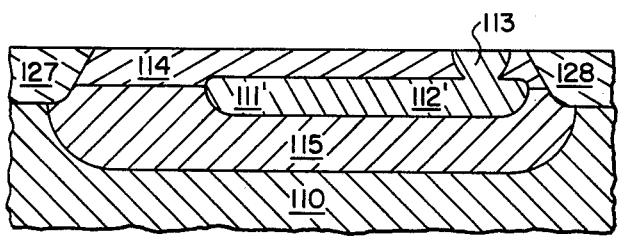
Figure 10F:
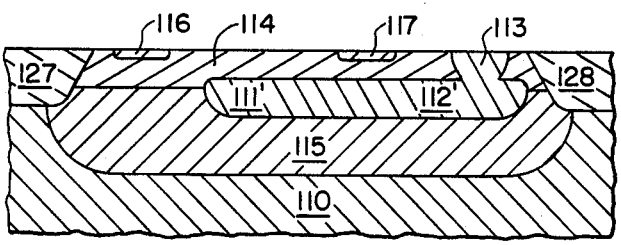

Next n-type epitaxial region, 114 of FIG. 10C, is grown using standard epitaxial growth techniques. This corresponds to the third step shown in FIG. 9. The heat associated with the epitaxial growth step causes some of the dopant of p+ regions 111 and 112 of FIG. 10B to diffuse into epitaxial layer 114, forming p+ regions 111' and 112'.

The next step of the bipolar process, as shown in FIG. 9, is the etching of grooves and the filling of those grooves with a dielectric material, typically silicon dioxide. This forms isolation regions 127 and 128 of FIG. 10D. The silicon dioxide may be either deposited or thermally grown.

Two steps of the bipolar process of FIG. 9, formation of sinker regions and formation of active base regions, are not required to be used in the manufacture of the field effect devices of the invention. These steps could be used in the manufacture of some field effect devices, however. The next step which is used in both processes is the formation of inactive base regions. In this step a dose of approximately $2 \times 10^{15}$ boron ions/cm$^2$ is implanted with an energy of 100 KeV, forming p+ interconnection region 113 of FIG. 10E.

The next step in the bipolar processing sequence of FIG. 9 is the formation of emitter regions. This step is used to form source and drain regions for the MESFET. The dopant used is one which will cause silicon to have n-type conductivity when implanted therein in sufficient quantities. Preferably arsenic is used. Typically a dose of $1 \times 10^{16}$ ions/cm$^2$ and an energy of 60 KeV are used for this implantation step. This forms source region 116 and drain region 117 of FIG. 10F.

After implantation of source region 116 and drain region 117 a thin oxide layer is grown on the surface of the semiconductor body. Openings are formed in appropriate places in the oxide layer so that metallic conductor pads may be installed to provide electrical contact to source region 116, drain region 117, and interconnection region 113. Additionally an opening for a gate electrode is formed in the oxide layer between source region 116 and drain region 117. A metallic contact pad is installed in contact with epitaxial layer 114 in this position. The resulting structure is similar to the structure of the device of FIG. 1. The only change is that buried distributed source region 16 of FIG. 1 is replaced by a surface source region similar to source region 16' of FIG. 2.

The embodiments of the invention in which an exclusive property or right is claimed are defined as follows:

1. A method of constructing a semiconductor field effect transistor in a body of semiconductor material simultaneously with the construction of bipolar semiconductor devices in said body of semiconductor material, said method comprising:
    implanting a first dopant, which will cause said semiconductor material to have a first conductivity type into a first region of a semiconductor substrate, said first region being adjacent to a surface of said substrate;
    implanting a second dopant, which will cause said semiconductor material to have a second conductivity type into a second region of said substrate, said second region being adjacent to said surface of said substrate and lying within said first region;
    growing an epitaxial layer of said semiconductor material having said first conductivity type, on said surface of said substrate to form said semiconductor body;
    etching grooves in said epitaxial layer;
    causing said grooves to be filled with a dielectric material;
    implanting a third dopant which will cause said semiconductor material to have said second conductivity type in said epitaxial layer to form an interconnection region, said interconnection region extending from a surface of said epitaxial layer to said second region of said substrate;
    implanting a fourth dopant which causes said semiconductor material to have said first conductivity type in said epitaxial layer, to form source and drain regions for said field effect transistor;
    forming a first electrical contact on said surface of said epitaxial layer at a location between said source and said drain regions; and
    forming a second electrical contact on said surface of said epitaxial layer and in contact with said interconnection region, wherein said first and said second electrical contacts are not directly electrically connected.

2. The method of claim 1 wherein said first conductivity type is n-type and said second conductivity type is p-type.

3. The method of claim 2 wherein said semiconductor material includes silicon.

4. A method of constructing a semiconductor field effect transistor in a body of semiconductor material simultaneously with the construction of bipolar semiconductor devices in said body of semiconductor material, said method comprising:
    implanting a first dopant, which will cause said semiconductor material to have a first conductivity type into a first region of a semiconductor substrate, said first region being adjacent to a surface of said substrate;
    implanting a second dopant, which will cause said semiconductor material to have a second conductivity type into a second region of said substrate, said second region being adjacent to said surface of said substrate and lying within said first region;
    growing an epitaxial layer of said semiconductor material having said first conductivity type, on said surface of said substrate to form said semiconductor body;
    etching grooves in said epitaxial layer;
    causing said grooves to be filled with a dielectric material;
    implanting a third dopant which will cause said semiconductor material to have said second conductivity type in said epitaxial layer to form an interconnection region, said interconnection region extending from a surface of said epitaxial layer to said second region of said substrate;
    implanting a fourth dopant which causes said semiconductor material to have said first conductivity type in said epitaxial layer, to form source and drain regions for said field effect transistor;
    implanting a fifth dopant which causes said semiconductor material to have a second conductivity type in a portion of said epitaxial layer which is between said source and drain regions and which extends from said surface of said epitaxial layer;
    forming a first electrical contact on said surface of said epitaxial layer and in contact with said portion of said epitaxial layer; and
    forming a second electrical contact on said surface of said epitaxial layer and in contact with said interconnection region, wherein said first and said second electrical contacts are not directly electrically connected.

* * * * *